United States Patent
Dole et al.

(10) Patent No.: US 10,741,407 B2
(45) Date of Patent: *Aug. 11, 2020

(54) REDUCTION OF SIDEWALL NOTCHING FOR HIGH ASPECT RATIO 3D NAND ETCH

(71) Applicant: Lam Research Corporation, Fremont, CA (US)

(72) Inventors: Nikhil Dole, Union City, CA (US); Takumi Yanagawa, Fremont, CA (US); Anqi Song, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/165,471

(22) Filed: Oct. 19, 2018

(65) Prior Publication Data
US 2020/0126804 A1  Apr. 23, 2020

(51) Int. Cl.
| | |
|---|---|
| *H01L 21/02* | (2006.01) |
| *H01L 21/311* | (2006.01) |
| *H01L 21/3213* | (2006.01) |
| *H01L 21/67* | (2006.01) |
| *H01L 27/115* | (2017.01) |

(52) U.S. Cl.
CPC .... *H01L 21/31116* (2013.01); *H01L 21/0212* (2013.01); *H01L 21/02175* (2013.01); *H01L 21/02274* (2013.01); *H01L 21/31144* (2013.01); *H01L 21/32133* (2013.01); *H01L 21/32137* (2013.01); *H01L 21/67069* (2013.01); *H01L 27/115* (2013.01)

(58) Field of Classification Search
None
See application file for complete search history.

(56) References Cited

U.S. PATENT DOCUMENTS

| | | | |
|---|---|---|---|
| 5,948,704 | A | 9/1999 | Benjamin et al. |
| 7,732,728 | B2 | 6/2010 | Dhindsa et al. |
| 7,740,736 | B2 | 6/2010 | Fischer et al. |
| 9,620,377 | B2 | 4/2017 | Hudson et al. |
| 9,673,058 | B1 | 6/2017 | Briggs et al. |
| 10,515,821 | B1 | 12/2019 | Dole et al. |
| 2011/0151670 | A1 | 6/2011 | Lee et al. |
| 2013/0157470 | A1 | 6/2013 | Watanabe et al. |
| 2014/0220785 | A1 | 8/2014 | Watanabe et al. |
| 2015/0050807 | A1 | 2/2015 | Wu et al. |
| 2018/0327913 | A1 | 11/2018 | Lansalot-Matras et al. |

(Continued)

OTHER PUBLICATIONS

U.S. Appl. No. 16/019,330, filed Jun. 26, 2018, Dole et al.

(Continued)

*Primary Examiner* — Stephanie P Duclair
(74) *Attorney, Agent, or Firm* — Weaver Austin Villeneuve & Sampson LLP

(57) ABSTRACT

Methods and apparatus for etching a high aspect ratio feature in a stack on a substrate are provided. The feature may be formed in the process of forming a 3D NAND device. Typically, the stack includes alternating layers of material such as silicon oxide and silicon nitride or silicon oxide and polysilicon. $WF_6$ is provided in the etch chemistry, which substantially reduces or eliminates problematic sidewall notching. Advantageously, this improvement in sidewall notching does not introduce other tradeoffs such as increased bowing, decreased selectivity, increased capping, or decreased etch rate.

18 Claims, 6 Drawing Sheets

(56) References Cited

U.S. PATENT DOCUMENTS

2019/0074191 A1  3/2019  Nagatomo et al.
2019/0393047 A1  12/2019  Dole et al.

OTHER PUBLICATIONS

Office Action dated May 13, 2019 issued in U.S. Appl. No. 16/019,330.
Notice of Allowance dated Aug. 23, 2019 issued in U.S. Appl. No. 16/019,330.
U.S. Appl. No. 16/688,639, filed Nov. 19, 2019, Dole et al.
Office Action dated Apr. 2, 2020 issued in U.S. Appl. No. 16/688,639.

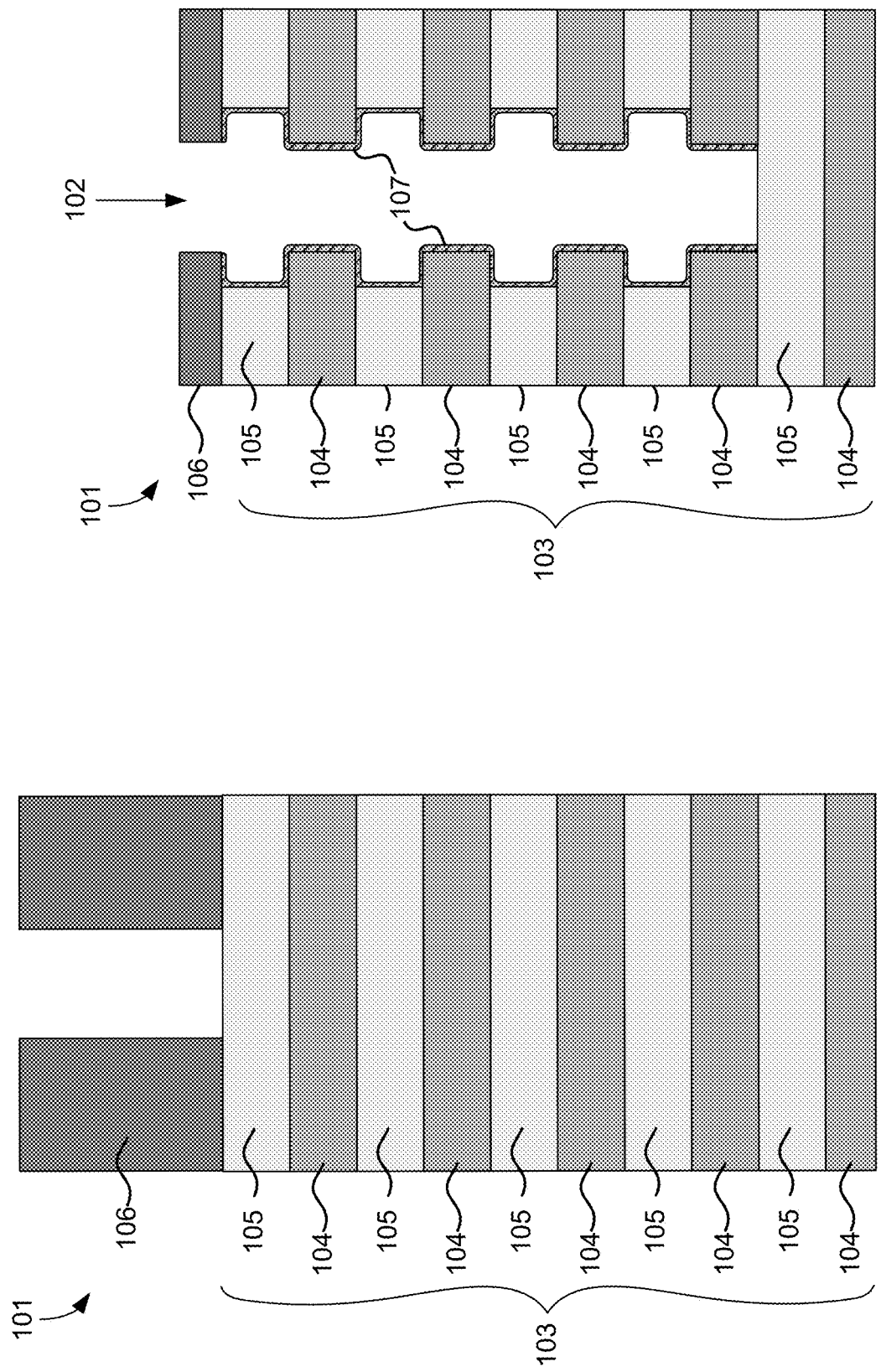

REDUCTION OF SIDEWALL NOTCHING FOR HIGH ASPECT RATIO 3D NAND ETCH

FIELD

Embodiments herein relate to methods and apparatus for fabricating a semiconductor device, and more particularly, for etching high aspect ratio features into dielectric-containing material with reduced sidewall notching and without profile tradeoffs.

BACKGROUND

One process frequently employed during fabrication of semiconductor devices is formation of an etched cylinder or other recessed feature in a stack of dielectric-containing material. For instance, such processes are commonly used in memory applications such as fabricating 3D NAND (also referred to as vertical NAND or V-NAND) structures. As the semiconductor industry advances and device dimensions become smaller, such features are increasingly difficult to etch in a uniform manner, especially for high aspect ratio cylinders having narrow widths and/or deep depths.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Certain embodiments herein relate to methods and apparatus for etching a feature in a stack including dielectric material. Typically, the feature is etched into the stack while fabricating a 3D NAND structure on a substrate.

In one aspect of the embodiments herein, a method of etching a feature in a stack including dielectric material while fabricating a 3D NAND structure is provided, the method including: receiving a substrate on a substrate support in a reaction chamber, the substrate including the stack and a mask layer that is patterned on top of the stack, where the stack includes either (a) alternating layers of silicon oxide and silicon nitride, or (b) alternating layers of silicon oxide and polysilicon; and exposing the substrate to a plasma in the reaction chamber to thereby etch the feature in the stack on the substrate, where the plasma is generated from a plasma generating gas including $WF_6$, one or more fluorocarbons and/or hydrofluorocarbons, and one or more oxidant, where a flow rate of $WF_6$ is between about 0.1-10 sccm, where the plasma is a capacitively coupled plasma, where the substrate is biased at a frequency between about 20 kHz and 1.5 MHz at an RF power level between about 500 W-20 kW per substrate, where the $WF_6$ and the fluorocarbons and/or hydrofluorocarbons form a tungsten-based polymer film on sidewalls of the feature during etching, and where the tungsten-based polymer film promotes a uniform etch rate between the alternating layers of silicon oxide and silicon nitride, or between the alternating layers of silicon oxide and polysilicon such that the sidewalls of the feature do not become notched during etching.

In certain embodiments, during etching the $WF_6$ may dissociate into tungsten-containing fragments and fluorine-containing fragments, where the tungsten-containing fragments remain relatively more concentrated near a top of the feature, as compared to the fluorine-containing fragments, and the fluorine-containing fragments penetrate deeper into the feature, as compared to the tungsten-containing fragments. In some such embodiments, the tungsten-based polymer film has a non-uniform composition along the sidewalls of the feature such that the tungsten-based polymer film near the top of the feature has a greater proportion of tungsten, as compared to the tungsten-based polymer film near a bottom of the feature.

In some cases, particular conditions may be used during processing. For instance, the plasma may be generated at an excitation frequency between about 20 MHz and 100 MHz and at an RF power of about 6.3 kW or less. In these or other cases, the oxidant may be $O_2$, and a flow rate of the $O_2$ may be between about 20-150 sccm. In these or other cases, the plasma generating gas may further include $SF_6$, and a flow rate of the $SF_6$ may be between about 1-20 sccm. In these or other cases, the plasma generating gas may further include Kr, and a flow rate of Kr may be between about 30-120 sccm. In these or other cases, the plasma generating gas may further include $NF_3$, and a flow rate of the $NF_3$ may be about 30 sccm or less. In these or other cases, the fluorocarbons or hydrofluorocarbons may include one or more of $C_4F_8$, $C_3F_8$, $C_4F_6$, and $CH_2F_2$, and a total flow rate of the fluorocarbons and hydrofluorocarbons may be between about 30-240 sccm. In these or other cases, the substrate support may be maintained at a temperature between about 20-80° C. while etching the substrate. In these or other cases, a pressure in the reaction chamber may be maintained between about 10-80 mTorr while etching the substrate. In these or other cases, the feature may be etched into the alternating layers of silicon oxide and silicon nitride. In these or other cases, the flow rate of $WF_6$ may be between about 0.02% and 10% of a total flow rate of the plasma generating gas. In these or other cases, the flow rate of $WF_6$ may be between about 0.02% and 1% of a total flow rate of the plasma generating gas. In these or other cases, the flow rate of $WF_6$ may be between about 0.02% and 0.5% of a total flow rate of the plasma generating gas. In these or other cases, the substrate may be biased at an RF frequency between about 300 kHz and 600 kHz. For example, the substrate may be biased at an RF frequency of about 400 kHz. In these or other cases, the tungsten-based polymer film may form at a first thickness on the layers of silicon oxide and at a second thickness on the layers of silicon nitride or polysilicon, the first and second thicknesses being different.

In another aspect of the disclosed embodiments, an apparatus for etching a feature in a stack including dielectric material while fabricating a 3D NAND structure on a substrate is provided, the apparatus including: a reaction chamber having a substrate support therein; a capacitively coupled plasma generator; an inlet for introducing material to the reaction chamber; an outlet for removing material from the reaction chamber; and a controller configured to cause any of the methods described herein.

For example, in a particular aspect of the disclosed embodiments, an apparatus for etching a feature in a stack including dielectric material while fabricating a 3D NAND structure on a substrate is provided, the apparatus including: a reaction chamber having a substrate support therein; a capacitively coupled plasma generator; an inlet for introducing material to the reaction chamber; an outlet for removing material from the reaction chamber; and a controller configured to cause: receiving the substrate on the substrate support in the reaction chamber, the substrate including the stack and a mask layer that is patterned on top of the stack, where the stack includes either (a) alternating layers of silicon oxide and silicon nitride, or (b) alternating layers of silicon oxide and polysilicon, generating plasma from a plasma generating gas including $WF_6$, one or more fluorocarbons and/or hydrofluorocarbons, and one or more oxidant, where a flow rate of $WF_6$ is between about 0.1-10 sccm, biasing the substrate at a frequency between about 20 kHz and 1.5 MHz at an RF power level between about 500 W-20 kW, exposing the substrate to the plasma in the reaction chamber to thereby etch the feature in the stack on the substrate, where the $WF_6$ and the fluorocarbons and/or hydrofluorocarbons form a tungsten-based polymer film on sidewalls of the feature during etching, and where the tungsten-based polymer film promotes a uniform etch rate between the alternating layers of silicon oxide and silicon nitride, or between the alternating layers of silicon oxide and polysilicon such that the sidewalls of the feature do not become notched during etching.

These and other features will be described below with reference to the associated drawings.

BRIEF DESCRIPTION OF THE DRAWINGS

FIG. 1 shows a substrate with a stack of alternating materials thereon.

FIG. 2 shows the substrate of FIG. 1 after an etching process that results in substantial sidewall notching.

DETAILED DESCRIPTION

Figure 3:
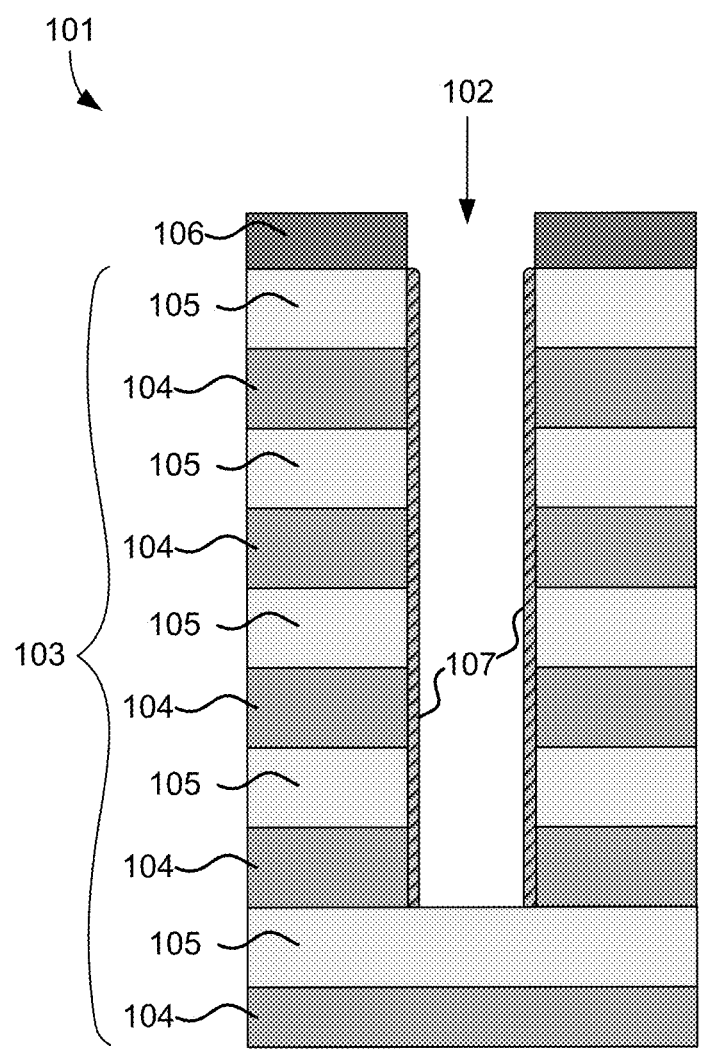
FIG. 3 shows the substrate of FIG. 1 after an etching process according to an embodiment herein.

FIGS. 1 and 2 illustrate a substrate 101 including a partially fabricated 3D NAND structure as a high aspect ratio feature 102 is etched into a stack 103 including alternating layers of a first material 104 and a second material 105. FIG. 1 shows the structure prior to etching, and FIG. 2 shows the structure after the high aspect ratio feature 102 is etched. In one example, the first material is silicon oxide and the second material is silicon nitride. In another example, the first material is silicon oxide and the second material is polysilicon. The alternating layers form pairs of materials. For the sake of clarity, FIGS. 1 and 2 show the feature being etched through only a few pairs of materials; however, it is understood that the etching operation typically etches through many more pairs of materials. In some cases, the number of pairs of materials may be at least about 20, at least about 30, at least about 40, at least about 60, or at least about 75. Each layer in the stack 103 may have a thickness between about 20-50 nm, for example between about 30-40 nm. Overlying the stack 103 is a mask layer 106. The mask layer 106 is patterned, with openings at locations where the high aspect ratio features 102 are to be etched. Example mask materials include, but are not limited to, amorphous carbon, polysilicon, and other common mask materials. The mask layer may be between about 1-2.5 µm thick prior to etching. The high aspect ratio feature 102 etched into the stack 103 may have a depth between about 3-10 µm, for example between about 5-10 µm. The high aspect ratio feature 102 may have a width/diameter between about 50-150 nm, for example between about 60-110 nm. In some cases the width of the feature may be about 100 nm or less. The pitch between adjacent features may be between about 100-200 nm, for example between about 120-170 nm.

The substrate 101 shown in FIG. 1 is provided to a semiconductor processing apparatus for etching. An appropriate apparatus is described below. After the substrate 101 is introduced to the processing apparatus, a plasma is generated in the processing apparatus and the substrate 101 is exposed to the plasma. After a period of time, this exposure to plasma causes etching on the substrate 101 in regions that are not protected by the mask layer 106, thereby forming high aspect ratio feature 102, as shown in FIG. 2. While the mask layer 106 is resistant to the etching chemistry, it typically experiences some erosion during the etching process. As such, the mask layer 106 shown in FIG. 2 is thinner than the mask layer 106 shown in FIG. 1. As the stack 103 is etched, a passivation layer 107 forms on sidewalls of the high aspect ratio feature 102. The passivation layer 107 is a mixed layer that forms from the materials in the stack 103, combined with one or more materials from the etching chemistry. As such, the composition of the passivation layer 107 depends on the composition of the layer on which it is formed. For example, a portion of passivation layer 107 forming on sidewalls of a silicon oxide layer will typically have a composition that includes at least silicon, oxygen, and carbon, while a portion of passivation layer 107 forming on sidewalls of a silicon nitride layer will typically have a composition that includes at least silicon, nitrogen, and carbon. Similarly, a portion of passivation layer 107 forming on sidewalls of a polysilicon layer will typically have a composition that includes at least silicon and carbon. In many cases the passivation layer is a fluorocarbon film, which may be polymeric.

While FIG. 2 shows the passivation layer 107 as relatively conformal and uniformly deposited, this may not be the case. In some cases the passivation layer 107 may be concentrated near the top of the high aspect ratio feature 102, with little or no passivation layer 107 near the bottom of the feature. In some cases, the passivation layer 107 may form unevenly between layers of the first material 104 and the layers of the second material 105, as discussed further below.

As shown in FIG. 2, one issue that can arise when etching stacks of alternating layers is an uneven etch rate between the two different layers. Often, silicon oxide material will vertically etch more quickly than silicon nitride or polysilicon materials. This high vertical etch rate in the oxide material results in relatively little horizontal etching of the oxide layers. By contrast, the nitride layers vertically etch more slowly, and horizontally etch to a greater degree. As a result of these mismatched etch rates, the sidewalls of the silicon nitride materials (or polysilicon materials) can form areas that are over-etched, thereby resulting in a notched sidewall. In the example of FIG. 2, the layers of the first material 104 (e.g., silicon oxide) horizontally etch to a lesser degree than the layers of the second material 105 (e.g., silicon nitride or polysilicon). Over time, the result of this uneven etching is a notched sidewall, as shown in FIG. 2. This notching is undesirable. Although not shown in FIG. 2, the notching can cause substantial ion scattering, which can lead to formation of a large bow (e.g., where the middle portion of a feature is over-etched compared to the top of the feature). The notching can also deleteriously affect the dielectric properties of the materials in the stack.

While FIG. 2 shows each layer in the stack 103 as having a vertical sidewall, this is not always the case. In various implementations, the layers of material which are horizontally over-etched (e.g., silicon nitride in an oxide-nitride stack, or polysilicon in an oxide-polysilicon stack) are over-etched most significantly near the top portion of the layer, thereby forming an undercut immediately below the other layer of material. The bottom portion of the layers which are over-etched may be over-etched to a lesser degree, or they may not be over-etched at all. Thus, the sidewalls of the layers which are over-etched may be slanted, curved, or otherwise non-vertical.

Without wishing to be bound by theory or mechanism of action, it is believed that the sidewall notching may be caused by uneven formation of the passivation layer 107 on the different materials in the stack 103. For example, the passivation layer 107 may form at a greater thickness on sidewalls of layers of the first material 104 (e.g., silicon oxide), as compared to sidewalls of layers of the second material 105 (e.g., silicon nitride or polysilicon). Thicker passivation layers 107 provide greater protection against lateral etching, and thus, the layers of the first material are laterally etched to a lesser degree than the layers of the second material, which have a thinner passivation layer 107 thereon.

Alternatively or in addition, the sidewall notching may be caused by an uneven etch rate of the two different materials. In some cases, this may cause formation of corners, particularly at intersections between an overlying layer that etches at a first rate and an underlying layer that etches at a different rate. These corners are exposed to substantial ion bombardment, which may cause formation of an undercut, particularly at the top region of the layers that are over-etched.

The sidewall notching may also be caused by a difference in stress between the two different types of layers. Regardless of the cause or causes, it is clear that sidewall notching is occurring.

Certain techniques have been developed to reduce sidewall notching. Often, these techniques include tuning the composition of the etch chemistry. More particularly, the etch chemistry has been tuned by controlling the ratios of nitrogen-containing species, oxygen-containing species, carbon-containing species, and fluorine-containing species in the plasma that etches the substrate. However, these techniques typically introduce tradeoffs related to the profile of the etched feature. For instance, such techniques may result in formation of a bow (e.g., where the middle portion of the feature is over-etched compared to the top of the feature), decreased selectivity, increased capping, or decreased etch rate. All of these results are undesirable.

It has been found that the inclusion of tungsten hexafluoride ($WF_6$) in the etch chemistry eliminates or substantially reduces sidewall notching, without introduction of tradeoffs related to bowing, selectivity, capping, or etch rate. The result is a much smoother sidewall on the etched feature. This result is highly desirable.

Without wishing to be bound by theory or mechanism of action, it is believed that the $WF_6$ may result in more equal vertical and/or horizontal etch rates between the first material (e.g., silicon oxide) and the second material (e.g., silicon nitride or polysilicon). For instance, the $WF_6$ may decrease the vertical etch rate of the first material (e.g., thereby increasing the horizontal etch rate of the first material) and/or increase the vertical etch rate of the second material (e.g., thereby decreasing the horizontal etch rate of the second material). Alternatively or in addition, the $WF_6$ may decrease the rate of formation of the passivation layer on sidewalls of the first material (e.g., silicon oxide) and/or increase the rate of formation of the passivation layer on sidewalls of the second material (e.g., silicon nitride or polysilicon). Alternatively or in addition, the $WF_6$ may combat differences in film stress or other properties between the two different kinds of layers.

The $WF_6$ may result in more even etch rates between the first and second materials as a result of excess F* in the plasma. Alternatively or in addition, the $WF_6$ may create a tungsten-based (e.g., in some cases tungsten oxide-based) sidewall polymer film, similar to passivation layer 107 of FIG. 2. The tungsten-based sidewall polymer film may deposit smoothly over the sidewalls of the various layers, thereby preventing any notching from forming.

$WF_6$ is commonly used to deposit tungsten-based film. However, $WF_6$ is not commonly used as part of etching chemistry. The improvement in sidewall notching that was observed in connection with the addition of $WF_6$ to the etch chemistry was unexpected.

FIG. 3 illustrates the substrate 101 of FIG. 1 after an etching process according to an embodiment herein. In this case, the etching chemistry includes $WF_6$. As a result, the first material 104 and second material 105 etch at a uniform rate, and the resulting sidewall is smooth. The passivating layer 107 is shown to be conformal and uniform in FIG. 3. However, this is not always the case. The passivating layer 107 may have a non-uniform thickness and/or composition. For example, it may be relatively thicker near the top of the feature and relatively thinner or non-existent near the bottom of the feature (or vice versa). In one case, the passivating layer 107 may have a composition that has relatively more tungsten near the top of the feature and relatively less tungsten near the bottom of the feature (or vice versa). In these or other cases, the passivating layer 107 may have a composition that has relatively less carbon at the top of the feature, and relatively more carbon at the bottom of the feature (or vice versa). In a particular embodiment, the passivating layer 107 may include two passivating layers, one of which is tungsten-based and another of which is carbon-based. The two passivating layers may overlap with one another (e.g., as separate layers or as a mixed layer) and/or they may form at different vertical locations within the feature (e.g., with the tungsten-based passivating layer being closer to the top of the feature or the bottom of the feature, as compared to the carbon-based passivating layer). As stated above in relation to FIG. 2, the composition of the passivating layer 107 may also depend upon the composition of the layer on which it forms.

In one particular embodiment, the tungsten in the passivating layer may be concentrated toward the top of the feature compared to the bottom of the feature. In other words, much of the tungsten from the $WF_6$ stays near the top of the feature. This may help preserve the mask layer in some cases. The concentration of tungsten near the top of the feature may be a result of the high sticking coefficient of tungsten and tungsten-containing species. When these high sticking coefficient species contact a sidewall, they are very likely to "stick" instead of bouncing off to travel further down into the feature. The fluorine from the $WF_6$ has a much lower sticking coefficient, and is able to penetrate to the bottom of the feature more easily, where it contributes to an increased etch rate. Both of these factors (e.g., tungsten-containing species staying near the top of the feature and fluorine-containing species traveling to the bottom of the feature to further etch the stack) ensure that the etch selectivity remains desirably high.

Figure 4:
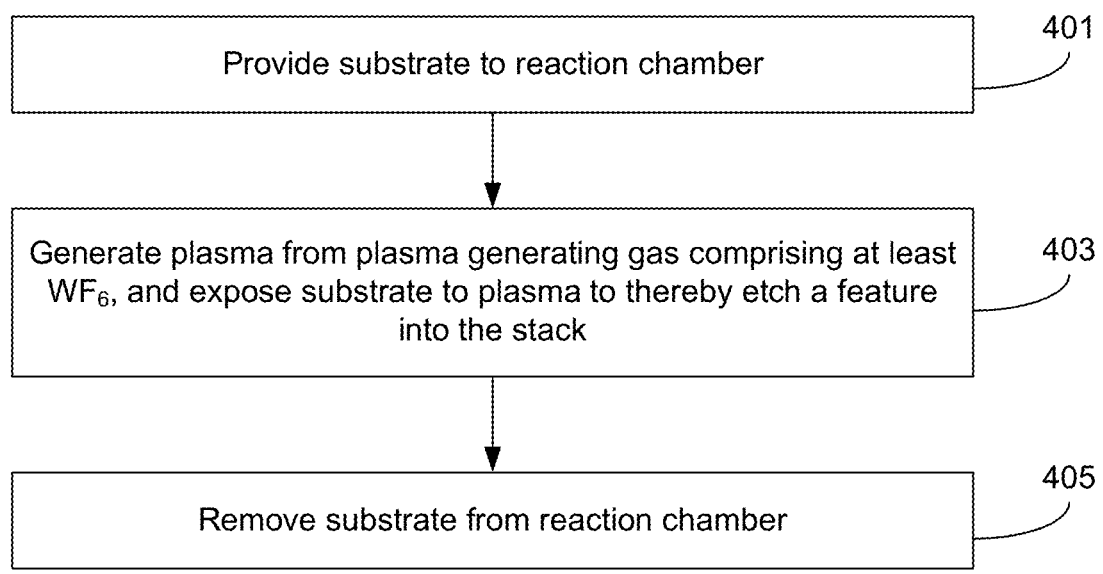
FIG. 4 is a flowchart that describes a method of etching in accordance with various embodiments herein.

FIG. 4 depicts a flowchart describing a method of etching a feature in a stack containing dielectric material according to various embodiments herein. The method begins with operation 401, where a substrate is provided to a reaction chamber. The substrate may be the substrate described in connection with FIG. 1, for example. Next, at operation 403, a plasma is generated from a plasma generating gas. The plasma generating gas includes at least $WF_6$. The plasma generating gas also includes etching chemistry appropriate for etching the materials in the stack. In various examples, the etching chemistry includes, e.g., one or more oxygen-containing species, one or more carbon-containing species, and one or more fluorine-containing species. Example materials that are commonly used in etch chemistry include, but are not limited to, fluorocarbons and hydrofluorocarbons such as $C_3F_8$, $C_4F_8$, $C_4F_6$, $CH_2F_2$, $CH_3F$, $CHF_3$, $C_5F_8$, $C_6F_6$, etc., oxidants such as $O_2$, $O_3$, $CO$, $CO_2$, $COS$, etc., and $NF_3$. Inert species may be provided in the plasma generating gas, as well.

The flow rate of $WF_6$ in the plasma generating gas may be at least about 0.1 sccm, or at least about 0.2 sccm, or at least about 0.5 sccm, or at least about 1 sccm. In these or other cases, the flow rate of $WF_6$ may be about 20 sccm or less, for example about 10 sccm or less, or about 5 sccm or less, or about 2 sccm or less, or about 1 sccm or less, or about 0.5 sccm or less. In a particular embodiment the flow rate of $WF_6$ may be between about 0.1-10 sccm. An overall flow rate of the plasma generating gas may be at least about 1 sccm, at least about 10 sccm, at least about 50 sccm, or at least about 80 sccm. In these or other cases, the overall flow rate of the plasma generating gas may be about 600 sccm or less, or about 500 sccm or less, or about 300 sccm or less, or about 200 sccm or less, or about 100 sccm or less, or about 50 sccm or less. In some cases, one or more fluorocarbon sources may be mixed (prior to or after delivery to the reaction chamber), for example to provide a desired ratio of carbon and fluorine. In some examples, a flow rate of $C_4F_8$ and/or $C_3F_8$ and/or $C_4F_6$ may be between about 20-120 sccm. In these or other examples, a flow rate of $CH_2F_2$ may be between about 10-120 sccm. In various embodiments, a total flow rate of fluorocarbons and hydrofluorocarbons may be between about 30-240 sccm. In these or other examples, a flow rate of $NF_3$ may be between about 0-30 sccm. In these or other examples, a flow rate of $O_2$ may be between about 20-150 sccm. In these or other examples, a flow rate of $SF_6$ may be between about 1-20 sccm. In these or other examples, a flow rate of Kr may be between about 30-120 sccm. In various cases, the $WF_6$ may represent at least about 0.02%, or at least about 0.05%, or at least about 0.1%, or at least about 0.5%, or at least about 1%, or at least about 3% of the volumetric flow rate of the plasma generating gas. In these or other cases, the $WF_6$ may represent about 10% or less, or about 5% or less, or about 1% or less, or about 0.5% or less, of the volumetric flow rate of the plasma generating gas.

In various cases, the following conditions may be used to generate the plasma. The plasma may be a capacitively coupled plasma. The plasma may be generated at an excitation frequency between about 13-169 MHz, for example between about 20-100 MHz (e.g., 60 MHz in a particular case), at a power level between about 0 Watts to 6.3 kW per 300 mm substrate. In various cases, the power level used to generate the plasma may be particularly high, for example about 5 kW or greater, or about 6 kW or greater per 300 mm substrate. A relatively high bias may be applied to the substrate, for example to promote a high vertical etch rate. The bias may be applied to the substrate at a frequency between about 20 kHz and 1.5 MHz, or between about 200 kHz and 1.5 MHz, or between about 300 kHz and 600 kHz (e.g., about 400 kHz in a particular case), at a power level between about 500 W and 20 kW per 300 mm substrate, or between about 2-10 kW per 300 mm substrate. In a particular embodiment, the substrate is biased at 400 kHz, at a power level between about 500 W and 20 kW. The pressure within the reaction chamber may be at least about 10 mTorr or at least about 30 mTorr. In these or other cases, the pressure within the reaction chamber may be about 500 mTorr or less, for example 100 mTorr or less, or about 80 mTorr or less, or about 30 mTorr or less. In some cases, the pressure may remain relatively low during etching (e.g., 10-80 mTorr), but increase to a higher pressure (e.g., 100-500 mTorr, or 300-500 mTorr, or 400-500 mTorr) for a cleaning operation to clean the internal walls of the reaction chamber. The substrate support on which the substrate is provided may be maintained at a temperature (e.g., through heating and/or cooling) between about −80° C. and 130° C. In some cases, the substrate support is maintained at a temperature of at least about −80° C., or at least about −50° C., or at least about −20° C., or at least about 0° C., or at least about 20° C., or at least about 50° C., or at least about 70° C. In these or other cases, the substrate support may be maintained at a temperature of about 130° C. or less, or about 120° C. or less, or about 100° C. or less, or about 80° C. or less, or about 50° C. or less, or about 20° C. or less, or about 0° C. or less, or about −20° C. or less, or about −50° C. or less. In a particular case the substrate support may be maintained at a temperature between about 20-80° C. These temperatures may relate to the controlled temperature of the substrate support while the substrate is exposed to plasma.

After a period of time, a feature begins to form in the stack. After the feature reaches its final etch depth, as shown in FIG. 3, the substrate is removed from the reaction chamber in operation 405. As compared with conventional approaches, the method described in relation to FIG. 4 is capable of forming deep features with relatively less (or no) notching. The inclusion of $WF_6$ in the plasma generating gas, when provided at an appropriate flow rate and under appropriate plasma conditions, substantially reduces or eliminates sidewall notching. Advantageously, this reduction of sidewall notching does not introduce tradeoffs in terms of feature bow, selectivity, capping, or etch rate.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 5A:
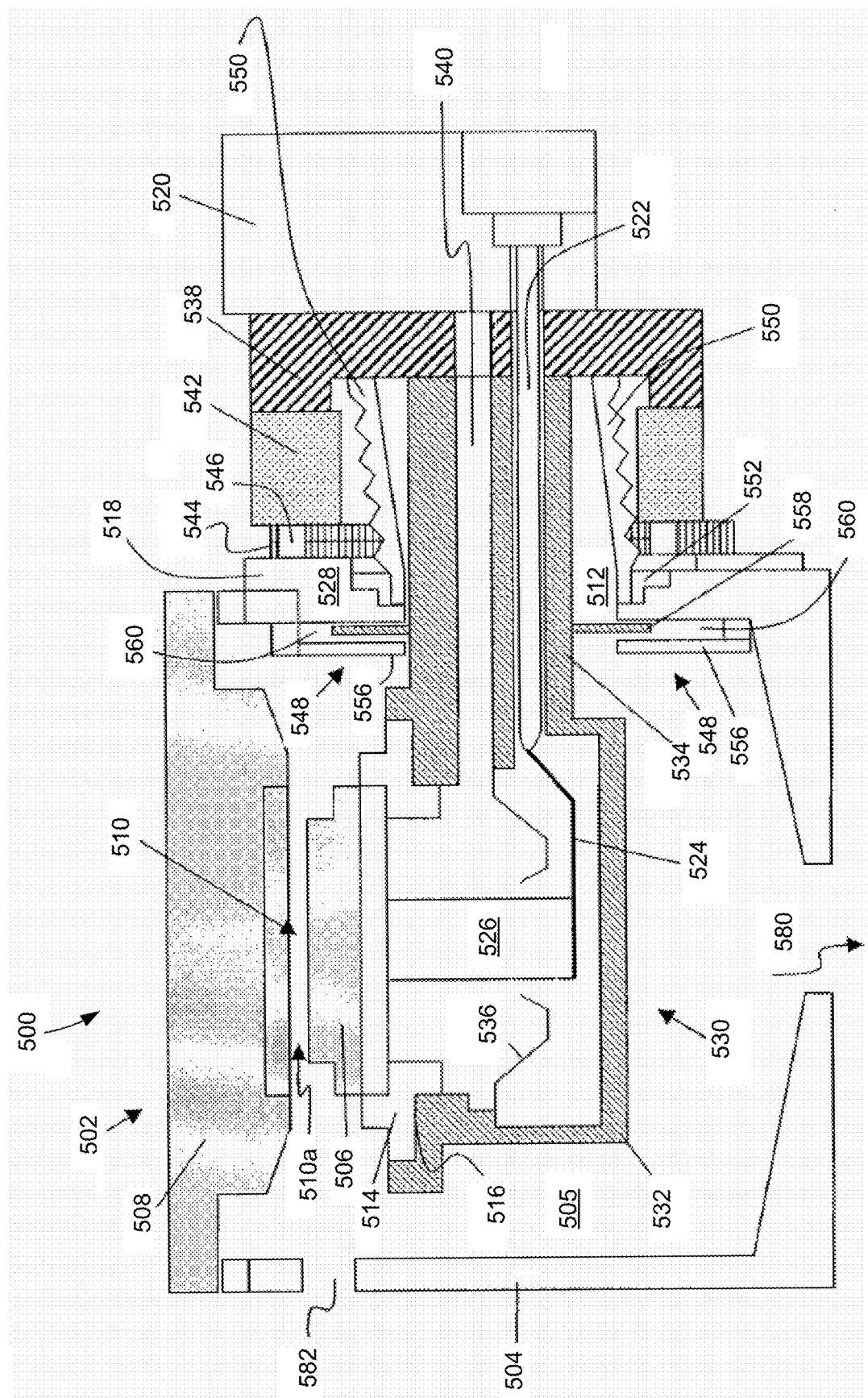
FIGS. 5A-5C illustrate a reaction chamber that may be used to perform the etching processes described herein according to certain embodiments.
Figure 5B:
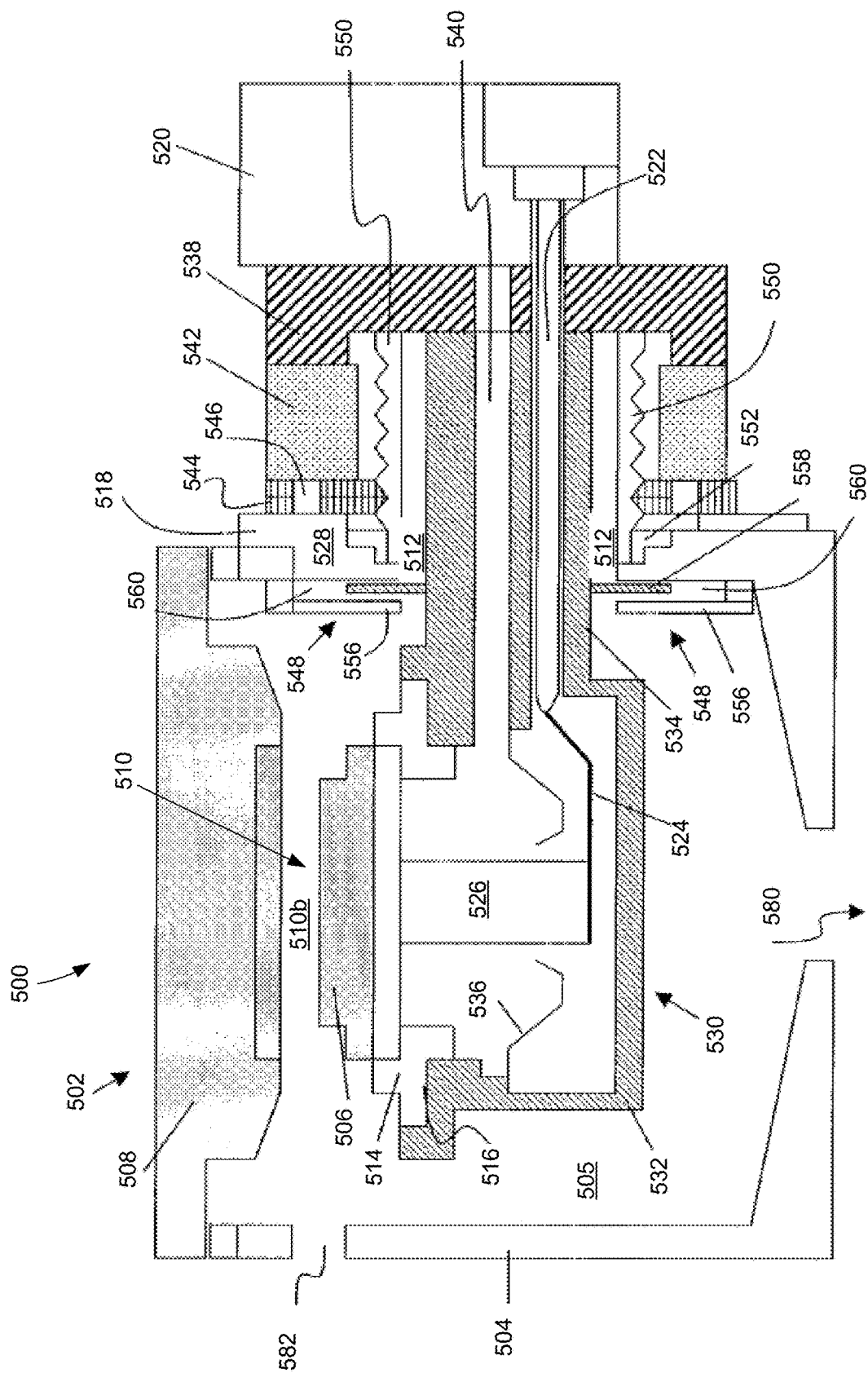
Figure 5C:
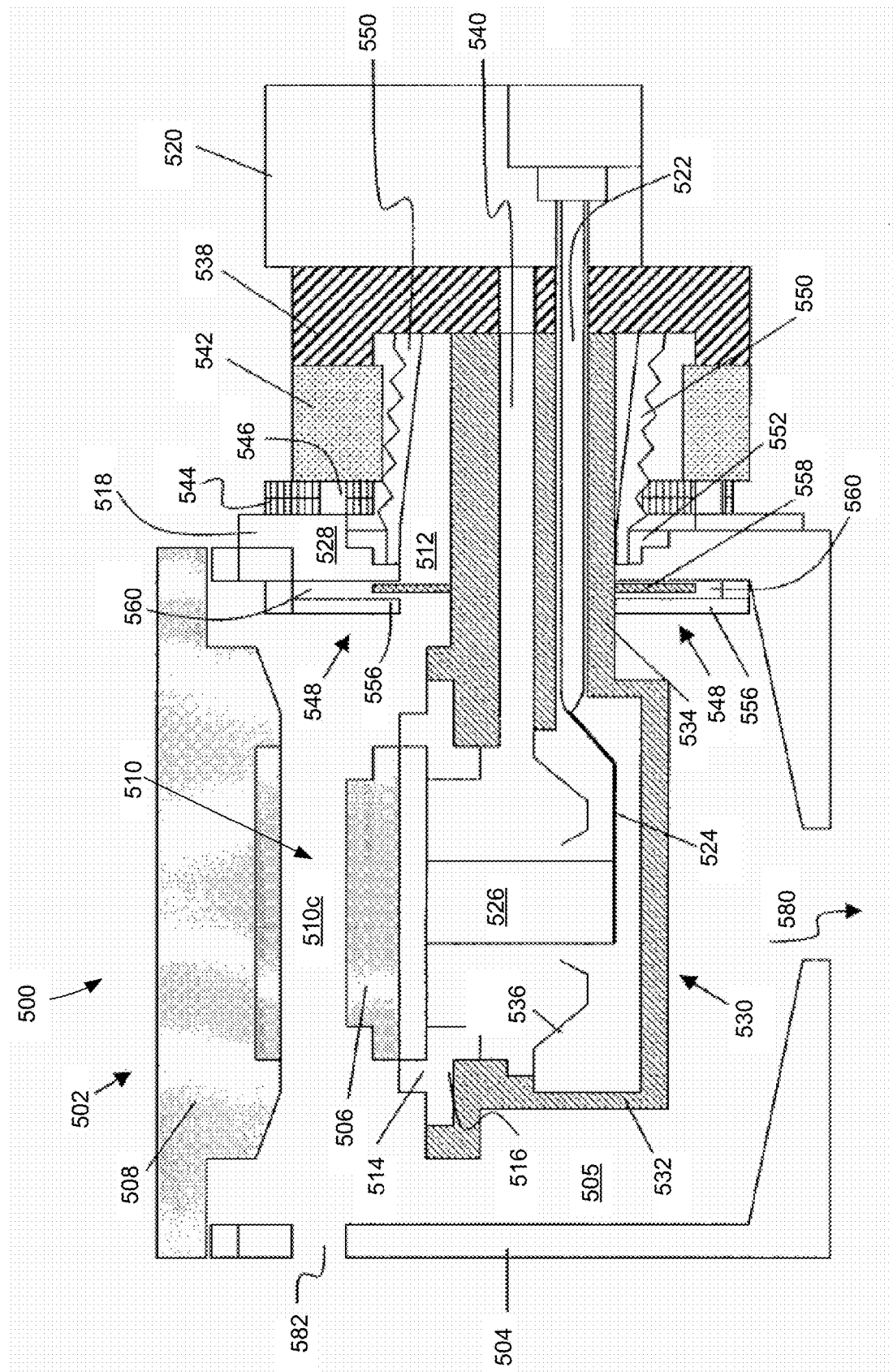

FIGS. 5A-5C illustrate an embodiment of an adjustable gap capacitively coupled confined RF plasma reactor 500 that may be used for performing the etching operations described herein. As depicted, a vacuum chamber 502 includes a chamber housing 504, surrounding an interior space housing a lower electrode 506. In an upper portion of the chamber 502 an upper electrode 508 is vertically spaced apart from the lower electrode 506. Planar surfaces of the upper and lower electrodes 508, 506 are substantially parallel and orthogonal to the vertical direction between the electrodes. Preferably the upper and lower electrodes 508, 506 are circular and coaxial with respect to a vertical axis. A lower surface of the upper electrode 508 faces an upper surface of the lower electrode 506. The spaced apart facing electrode surfaces define an adjustable gap 510 therebetween. During operation, the lower electrode 506 is supplied RF power by an RF power supply (match) 520. RF power is supplied to the lower electrode 506 though an RF supply conduit 522, an RF strap 524 and an RF power member 526. A grounding shield 536 may surround the RF power member 526 to provide a more uniform RF field to the lower electrode 506. As described in commonly-owned U.S. Pat. No. 7,732,728, the entire contents of which are herein incorporated by reference, a wafer is inserted through wafer port 582 and supported in the gap 510 on the lower electrode 506 for processing, a process gas is supplied to the gap 510 and excited into plasma state by the RF power. The upper electrode 508 can be powered or grounded.

In the embodiment shown in FIGS. 5A-5C, the lower electrode 506 is supported on a lower electrode support plate 516. An insulator ring 514 interposed between the lower electrode 506 and the lower electrode Support plate 516 insulates the lower electrode 506 from the support plate 516.

An RF bias housing 530 supports the lower electrode 506 on an RF bias housing bowl 532. The bowl 532 is connected through an opening in a chamber wall plate 518 to a conduit support plate 538 by an arm 534 of the RF bias housing 530. In a preferred embodiment, the RF bias housing bowl 532 and RF bias housing arm 534 are integrally formed as one component, however, the arm 534 and bowl 532 can also be two separate components bolted or joined together.

The RF bias housing arm 534 includes one or more hollow passages for passing RF power and facilities, such as gas coolant, liquid coolant, RF energy, cables for lift pin control, electrical monitoring and actuating signals from outside the vacuum chamber 502 to inside the vacuum chamber 502 at a space on the backside of the lower electrode 506. The RF supply conduit 522 is insulated from the RF bias housing arm 534, the RF bias housing arm 534 providing a return path for RF power to the RF power supply 520. A facilities conduit 540 provides a passageway for facility components. Further details of the facility components are described in U.S. Pat. Nos. 5,948,704 and 7,732,728 and are not shown here for simplicity of description. The gap 510 is preferably surrounded by a confinement ring assembly or shroud (not shown), details of which can be found in commonly owned published U.S. Pat. No. 7,740,736 herein incorporated by reference. The interior of the vacuum chamber 502 is maintained at a low pressure by connection to a vacuum pump through vacuum portal 580.

The conduit support plate 538 is attached to an actuation mechanism 542. Details of an actuation mechanism are described in commonly-owned U.S. Pat. No. 7,732,728 incorporated herein by above. The actuation mechanism 542, such as a servo mechanical motor, stepper motor or the like is attached to a vertical linear bearing 544, for example, by a screw gear 546 such as a ball screw and motor for rotating the ball screw. During operation to adjust the size of the gap 510, the actuation mechanism 542 travels along the vertical linear bearing 544. FIG. 5A illustrates the arrangement when the actuation mechanism 542 is at a high position on the linear bearing 544 resulting in a small gap 510 a. FIG. 5B illustrates the arrangement when the actuation mechanism 542 is at a mid position on the linear bearing 544. As shown, the lower electrode 506, the RF bias housing 530, the conduit support plate 538, the RF power supply 520 have all moved lower with respect to the chamber housing 504 and the upper electrode 508, resulting in a medium size gap 510 b.

FIG. 5C illustrates a large gap 510 c when the actuation mechanism 542 is at a low position on the linear bearing. Preferably, the upper and lower electrodes 508, 506 remain co-axial during the gap adjustment and the facing surfaces of the upper and lower electrodes across the gap remain parallel.

This embodiment allows the gap 510 between the lower and upper electrodes 506, 508 in the CCP chamber 502 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 506, 508.

FIG. 5A illustrates laterally deflected bellows 550 sealed at a proximate end to the conduit support plate 538 and at a distal end to a stepped flange 528 of chamber wall plate 518. The inner diameter of the stepped flange defines an opening 512 in the chamber wall plate 518 through which the RF bias housing arm 534 passes. The distal end of the bellows 550 is clamped by a clamp ring 552.

The laterally deflected bellows 550 provides a vacuum seal while allowing vertical movement of the RF bias housing 530, conduit support plate 538 and actuation mechanism 542. The RF bias housing 530, conduit support plate 538 and actuation mechanism 542 can be referred to as a cantilever assembly. Preferably, the RF power supply 520 moves with the cantilever assembly and can be attached to the conduit support plate 538. FIG. 5B shows the bellows 550 in a neutral position when the cantilever assembly is at a mid position. FIG. 5C shows the bellows 550 laterally deflected when the cantilever assembly is at a low position.

A labyrinth seal 548 provides a particle barrier between the bellows 550 and the interior of the plasma processing chamber housing 504. A fixed shield 556 is immovably attached to the inside inner wall of the chamber housing 504 at the chamber wall plate 518 so as to provide a labyrinth groove 560 (slot) in which a movable shield plate 558 moves vertically to accommodate vertical movement of the cantilever assembly. The outer portion of the movable shield plate 558 remains in the slot at all vertical positions of the lower electrode 506.

In the embodiment shown, the labyrinth seal 548 includes a fixed shield 556 attached to an inner surface of the chamber wall plate 518 at a periphery of the opening 512 in the chamber wall plate 518 defining a labyrinth groove 560. The movable shield plate 558 is attached and extends radially from the RF bias housing arm 534 where the arm 534 passes through the opening 512 in the chamber wall plate 518. The movable shield plate 558 extends into the labyrinth groove 560 while spaced apart from the fixed shield 556 by a first gap and spaced apart from the interior surface of the chamber wall plate 518 by a second gap allowing the cantilevered assembly to move vertically. The labyrinth seal 548 blocks migration of particles spalled from the bellows 550 from entering the vacuum chamber interior 505 and blocks radicals from process gas plasma from migrating to the bellows 550 where the radicals can form deposits which are subsequently spalled.

FIG. 5A shows the movable shield plate 558 at a higher position in the labyrinth groove 560 above the RF bias housing arm 534 when the cantilevered assembly is in a high position (small gap 510 a). FIG. 5C shows the movable shield plate 558 at a lower position in the labyrinth groove 560 above the RF bias housing arm 534 when the cantilevered assembly is in a low position (large gap 510 c). FIG. 5B shows the movable shield plate 558 in a neutral or mid position within the labyrinth groove 560 when the cantilevered assembly is in a mid position (medium gap 510 b). While the labyrinth seal 548 is shown as symmetrical about the RF bias housing arm 534, in other embodiments the labyrinth seal 548 may be asymmetrical about the RF bias arm 534.

FIG. 6 depicts a semiconductor process cluster architecture with various modules that interface with a vacuum transfer module 638 (VTM). The arrangement of transfer modules to "transfer" substrates among multiple storage facilities and processing modules may be referred to as a "cluster tool architecture" system. Airlock 630, also known as a loadlock or transfer module, is shown in VTM 638 with four processing modules 620a-620d, which may be individually optimized to perform various fabrication processes. By way of example, processing modules 620a-620d may be implemented to perform substrate etching, deposition, ion implantation, substrate cleaning, sputtering, and/or other semiconductor processes as well as laser metrology and other defect detection and defect identification methods. One or more of the processing modules (any of 620a-620d) may be implemented as disclosed herein, i.e., for etching recessed features into substrates. Airlock 630 and process modules 620a-620d may be referred to as "stations." Each station has a facet 636 that interfaces the station to VTM 638. Inside the facets, sensors 1-18 are used to detect the passing of substrate 626 when moved between respective stations.

Robot 622 transfers substrates between stations. In one implementation, the robot may have one arm, and in another implementation, the robot may have two arms, where each arm has an end effector 624 to pick substrates for transport. Front-end robot 632, in atmospheric transfer module (ATM) 640, may be used to transfer substrates from cassette or Front Opening Unified Pod (FOUP) 634 in Load Port Module (LPM) 642 to airlock 630. Module center 628 inside process modules 620a-620d may be one location for placing the substrate. Aligner 644 in ATM 640 may be used to align substrates.

In an exemplary processing method, a substrate is placed in one of the FOUPs 634 in the LPM 642. Front-end robot 632 transfers the substrate from the FOUP 634 to the aligner 644, which allows the substrate 626 to be properly centered before it is etched, or deposited upon, or otherwise processed. After being aligned, the substrate is moved by the front-end robot 632 into an airlock 630. Because airlock modules have the ability to match the environment between an ATM and a VTM, the substrate is able to move between the two pressure environments without being damaged. From the airlock module 630, the substrate is moved by robot 622 through VTM 638 and into one of the process modules 620a-620d, for example process module 620a. In order to achieve this substrate movement, the robot 622 uses end effectors 624 on each of its arms. In process module 620a, the substrate undergoes etching as described. Next, the robot 622 moves the substrate out of processing module 620a to its next desired position.

It should be noted that the computer controlling the substrate movement can be local to the cluster architecture, or can be located external to the cluster architecture in the manufacturing floor, or in a remote location and connected to the cluster architecture via a network.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Additional Embodiments

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The above detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like. Unless otherwise defined for a particular parameter, the terms "about" and "approximately" as used herein are intended to mean±10% with respect to a relevant value.

In the above description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it is understood that it is not intended to limit the disclosed embodiments. The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of etching a feature in a stack comprising dielectric material while fabricating a 3D NAND structure, the method comprising:

receiving a substrate on a substrate support in a reaction chamber, the substrate comprising the stack and a mask layer that is patterned on top of the stack, wherein the stack comprises either (a) alternating layers of silicon oxide and silicon nitride, or (b) alternating layers of silicon oxide and polysilicon; and exposing the substrate to a plasma in the reaction chamber to thereby etch the feature in the stack on the substrate, wherein the plasma is generated from a plasma generating gas comprising $WF_6$, one or more fluorocarbons and/or hydrofluorocarbons, and one or more oxidant, wherein a flow rate of $WF_6$ is between about 0.1-10 sccm, wherein the plasma is a capacitively coupled plasma, wherein the substrate is biased at a frequency between about 20 kHz and 1.5 MHz at an RF power level between about 500 W 20 kW per substrate, wherein the $WF_6$ and the fluorocarbons and/or hydrofluorocarbons form a tungsten-based polymer film on sidewalls of the feature during etching, and wherein the tungsten-based polymer film promotes a uniform etch rate between the alternating layers of silicon oxide and silicon nitride, or between the alternating layers of silicon oxide and polysilicon such that the sidewalls of the feature do not become notched during etching, wherein during etching, the $WF_6$ dissociates into tungsten-containing fragments and fluorine-containing fragments, wherein the tungsten-containing fragments remain relatively more concentrated near a top of the feature, as compared to the fluorine-containing fragments, and the fluorine-containing fragments penetrate deeper into the feature, as compared to the tungsten-containing fragments.

2. The method of claim 1, wherein the tungsten-based polymer film has a non-uniform composition along the sidewalls of the feature such that the tungsten-based polymer film near the top of the feature has a greater proportion of tungsten, as compared to the tungsten-based polymer film near a bottom of the feature.

3. The method of claim 1, wherein the plasma is generated at an excitation frequency between about 20 MHz and 100 MHz and at an RF power of about 6.3 kW or less.

4. The method of claim 3, wherein the oxidant is $O_2$, and wherein a flow rate of the $O_2$ is between about 20-150 sccm.

5. The method of claim 4, wherein the plasma generating gas further comprises $SF_6$, and wherein a flow rate of the $SF_6$ is between about 1-20 sccm.

6. The method of claim 5, wherein the plasma generating gas further comprises Kr, and wherein a flow rate of Kr is between about 30-120 sccm.

7. The method of claim 6, wherein the plasma generating gas further comprises $NF_3$, and wherein a flow rate of the $NF_3$ is about 30 sccm or less.

8. The method of claim 7, wherein the fluorocarbons or hydrofluorocarbons comprise one or more of $C_4F_8$, $C_3F_8$, $C_4F_6$, and $CH_2F_2$, and wherein a total flow rate of the fluorocarbons and hydrofluorocarbons is between about 30-240 sccm.

9. The method of claim 8, wherein the substrate support is maintained at a temperature between about 20-80° C. while etching the substrate.

10. The method of claim 9, wherein a pressure in the reaction chamber is maintained between about 10-80 mTorr while etching the substrate.

11. The method of claim 10, wherein the feature is etched into the alternating layers of silicon oxide and silicon nitride.

12. The method of claim 10, wherein the flow rate of $WF_6$ is between about 0.02% and 10% of a total flow rate of the plasma generating gas.

13. The method of claim 12, wherein the flow rate of $WF_6$ is between about 0.02% and 1% of a total flow rate of the plasma generating gas.

14. The method of claim 13, wherein the flow rate of $WF_6$ is between about 0.02% and 0.5% of a total flow rate of the plasma generating gas.

15. The method of claim 1, wherein the substrate is biased at an RF frequency between about 300 kHz and 600 kHz.

16. The method of claim 15, wherein the substrate is biased at an RF frequency of about 400 kHz.

17. The method of claim 1, wherein the tungsten-based polymer film forms at a first thickness on the layers of silicon oxide and at a second thickness on the layers of silicon nitride or polysilicon, the first and second thicknesses being different.

18. A method of etching a feature in a stack comprising dielectric material while fabricating a 3D NAND structure, the method comprising:
   receiving a substrate on a substrate support in a reaction chamber, the substrate comprising the stack and a mask layer that is patterned on top of the stack, wherein the stack comprises either (a) alternating layers of silicon oxide and silicon nitride, or (b) alternating layers of silicon oxide and polysilicon; and
   exposing the substrate to a plasma in the reaction chamber to thereby etch the feature in the stack on the substrate,
   wherein the plasma is generated from a plasma generating gas comprising $WF_6$, one or more fluorocarbons and/or hydrofluorocarbons, and one or more oxidant, wherein a flow rate of $WF_6$ is between about 0.1-10 sccm,
   wherein the plasma is a capacitively coupled plasma,
   wherein the substrate is biased at a frequency between about 20 kHz and 1.5 MHz at an RF power level between about 500 W 20 kW per substrate,
   wherein the $WF_6$ and the fluorocarbons and/or hydrofluorocarbons form a tungsten-based polymer film on sidewalls of the feature during etching, and wherein the tungsten-based polymer film promotes a uniform etch rate between the alternating layers of silicon oxide and silicon nitride, or between the alternating layers of silicon oxide and polysilicon such that the sidewalls of the feature do not become notched during etching,
   wherein the tungsten-based polymer film has a non-uniform composition along the sidewalls of the feature such that the tungsten-based polymer film near a top of the feature has a greater proportion of tungsten, as compared to the tungsten-based polymer film near a bottom of the feature.

* * * * *